(12) United States Patent
Ueda

(10) Patent No.: US 7,411,851 B2
(45) Date of Patent: Aug. 12, 2008

(54) SEMICONDUCTOR DEVICE

(75) Inventor: Takehiro Ueda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 191 days.

(21) Appl. No.: 11/333,359

(22) Filed: Jan. 18, 2006

(65) Prior Publication Data
US 2006/0171229 A1 Aug. 3, 2006

(30) Foreign Application Priority Data
Jan. 28, 2005 (JP) ............... 2005-021108

(51) Int. Cl.
G11C 17/18 (2006.01)
(52) U.S. Cl. .............. 365/225.7; 365/96; 365/200
(58) Field of Classification Search .............. 365/225.7, 365/185.09, 96, 200; 324/550, 507
See application file for complete search history.

(56) References Cited

U.S. PATENT DOCUMENTS 6,489,832 B1 * 12/2002 Kim et al. ............... 327/525
6,566,937 B1 * 5/2003 Mori et al. ............... 327/525
7,030,641 B1 * 4/2006 Tang et al. ............... 324/765
2005/0169071 A1 * 8/2005 Kobayashi et al. .......... 365/200

FOREIGN PATENT DOCUMENTS

JP 6-140510 5/1994

* cited by examiner

Primary Examiner—Richard T. Elms
Assistant Examiner—Han Yang
(74) Attorney, Agent, or Firm—Young & Thompson

(57) ABSTRACT

A fuse peripheral circuit shown in FIG. 2 has a fuse 10, a potential difference imparting circuit 20, a potential difference reducing circuit 30, a terminal 40, a memory circuit 50, a transfer gate 60, and a logic gate 70. The potential difference imparting circuit 20 is configured as having a transfer gate 22 (first transfer gate), a terminal 24 (first terminal) and a terminal 26, so as to give a predetermined potential difference between both ends of the fuse 10 when disconnection of the fuse 10 is judged. The potential difference reducing circuit 30 is configured as having a transfer gate 32 (second transfer gate), a terminal 34 (second terminal) and a terminal 36, and reduces the potential difference between both ends of the fuse 10 applied by the above-described potential difference imparting circuit 20.

7 Claims, 10 Drawing Sheets

SEMICONDUCTOR DEVICE

This application is based on Japanese patent application No. 2005-021108, the content of which is incorporated hereinto by reference.

BACKGROUND

1. Technical Field

The present invention relates to a semiconductor device.

2. Related Art

Fabrication of semiconductor memory cannot completely be exempt from failure in the memory cell. It is therefore general practice to configure the circuit in a redundant manner in order to rescue the semiconductor memory containing defective cells.

This configuration allows even a semiconductor memory having defective memory cells to normally operate, by replacing fault bits with redundant bits. The replacement is effected using a fuse as described in Japanese Laid-Open Patent Publication No. 6-140510. That is, interconnection is replaced by blowing the fuse.

FIG. 10 is a circuit drawing showing a fuse peripheral circuit described in the patent publication in the above. In this configuration, a fuse 100 is blown by bringing a terminal 101 to a high level to thereby turn an NFET transistor 102 on. This allows current to flow through the fuse 100, so that the fuse 100 blows.

Whether the fuse 100 has been blown or not can be judged by raising the level of a terminal 103 to high, to thereby bring the node 104 low. Next, the terminal 103 is switched to low, to thereby turn a PFET transistor 105 on. In this case, the node 104 remains low if the fuse 100 is blown. On the other hand, if the fuse is not blown, both of the fuse 100 and the transistor 105 electrically conduct to thereby bring the node 104 high. It is therefore made possible to judge whether the fuse 100 is blown or not based on the potential appears at the node 104.

SUMMARY OF THE INVENTION

The present inventors found out the subjects described below. The fuse 100 in the configuration shown in FIG. 10, even after the judgment of disconnection of the fuse, remains under applied voltage on both ends thereof. This raises a problem of migration of interconnection metal, known as electro-migration, and the metal may short-circuit the blown fuse 100.

According to the present invention, there is provided a semiconductor device which has a fuse; a potential difference imparting circuit imparting a predetermined potential difference between both ends of the fuse when disconnection of the fuse is judged; and a potential difference reducing circuit reducing the potential difference applied between both ends of the fuse.

The semiconductor device includes the potential difference reducing circuit provided therein. The potential difference applied by the potential difference imparting circuit between both ends of the fuse, when the disconnection is judged, can therefore be reduced after the judgment. This successfully reduces a risk of short-circuiting of the blown fuse.

The potential difference reducing circuit is preferably configured so as to nearly equalize the potential on both sides of the fuse. More specifically, the potential difference reducing circuit is preferably such as being connected to one end of the fuse, so as to nearly equalize the potential with potential on the other end of the fuse. This makes it possible to effectively suppress the electro-migration, for example, after disconnection of the fuse.

The semiconductor device may further include a terminal connected to one end of the fuse, supplying current to the fuse when the fuse is blown, wherein the terminal may be grounded. This configuration is beneficial to lower power consumption of the semiconductor device.

The potential difference imparting circuit may have a first transfer gate, and a first terminal connected through the first transfer gate to the other end of the fuse, being applied with a second potential higher than a first potential applied to one end of the fuse; wherein the potential difference reducing circuit may have a second transfer gate, and a second terminal connected through the second transfer gate to the other end of the fuse, being applied with a third potential not lower than the first potential and lower than the second potential. The potential difference imparting circuit may still also have a first transfer gate, and a first terminal connected through the first transfer gate to the other end of the fuse, being applied with a second potential lower than a first potential applied to one end of the fuse; wherein the potential difference reducing circuit may have a second transfer gate, and a second terminal connected through the second transfer gate to the other end of the fuse, being applied with a third potential higher than the second potential and not higher than the first potential. These cases make it possible to realize the potential difference imparting circuit and the potential difference reducing circuit having the above-described functions only with simple configurations.

The semiconductor device may additionally include a memory circuit storing a signal which indicates result of judgment on whether the fuse has been blown or not, and a third transfer gate provided on a path between the memory circuit and the fuse. In this case, flow of the signal from the memory circuit to the fuse can be blocked by the third transfer gate. This makes it possible to maintain only with simple configurations a state of reducing the potential difference between both ends of the fuse achieved by the potential difference reducing circuit.

The present invention can realize a semiconductor device capable of reducing a risk of short-circuiting of the blown fuse.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
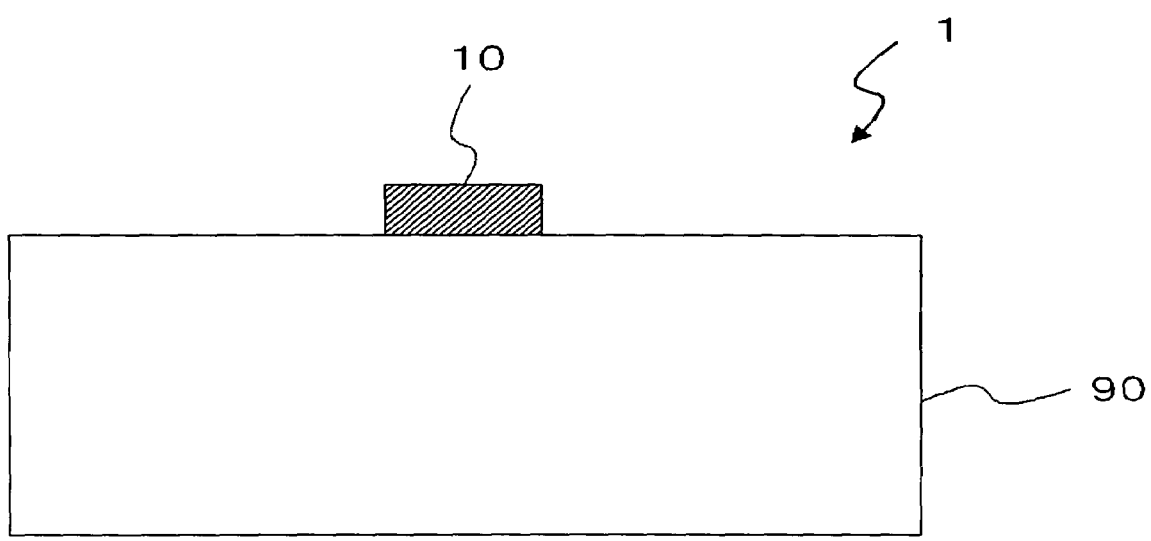
FIG. 1 is a sectional view showing the first embodiment of a semiconductor device according to the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Next paragraphs will describe preferable embodiment of the semiconductor device of the present invention, referring to the attached drawings. In the description of the drawings, any identical constituents will be given with the same reference numerals so as to avoid repetitive explanation.

First Embodiment

FIG. 1 is a sectional view showing the first embodiment of the semiconductor device according to the present invention. A semiconductor device 1 has a semiconductor substrate 90, a fuse provided on the semiconductor substrate 90, and a fuse peripheral circuit configured as including the fuse 10. It is to be noted that FIG. 1 shows only the semiconductor substrate 90 and the fuse 10, while omitting illustration of any other constituents.

A configuration of the fuse peripheral circuit will be explained referring to FIG. 2. The fuse peripheral circuit has the fuse 10, a potential difference imparting circuit 20, a potential difference reducing circuit 30, a terminal 40, a memory circuit 50, a transfer gate 60, and a logic gate 70.

The potential difference imparting circuit 20 is configured as containing a transfer gate 22 (first transfer gate), a terminal 24 (first terminal) and a terminal 26, wherein a predetermined potential difference is given between both ends of the fuse 10 when disconnection of the fuse 10 is judged. The transfer gate 22 is a P-type FET (field effect transistor). The terminal 24 is connected to the source of the transfer gate 22. The terminal 24 is applied with a source potential $V_{cc}$ (second potential). $V_{cc}$ has a value larger than that of the potential (first potential) applied to an end portion 10a of the fuse 10. It is to be noted that, in the first embodiment, the first potential equals to the ground potential as described later. It is therefore obvious that the potential difference applied to the fuse 10 is given as $V_{cc}$.

The terminal 26 is connected to the gate of the transfer gate 22. The terminal 26 is applied with a potential switching the transfer gate 22 between ON and OFF. The drain of the transfer gate 22 is connected to an end portion 10b of the fuse 10. In other words, the configuration herein is such as having the terminal 24 connected through the transfer gate 22 to the end portion 10b.

The potential difference reducing circuit 30 is configured as having a transfer gate 32 (second transfer gate), a terminal 34 (second terminal) and a terminal 36, so as to reduce the potential difference applied between both ends of the fuse 10 by the potential difference imparting circuit 20. The transfer gate 32 is an N-type FET. The terminal 34 is connected to the source of the transfer gate 32. The terminal 34 is grounded. In other words, the terminal 34 is given with the ground potential (third potential). The terminal 36 is connected to the gate of the transfer gate 32. The terminal 36 is applied with a potential switching the transfer gate 32 between ON and OFF. The drain of the transfer gate 32 is connected to the end portion 10b. In other words, the configuration herein is such as having the terminal 34 connected through the transfer gate 32 to the end portion 10b.

The terminal 40 is connected to the end portion 10a of the fuse 10. The terminal 40 is a terminal supplying therethrough a necessary current to the fuse 10 when the fuse 10 is blown. The terminal 40 in the first embodiment is grounded. In other words, the terminal 40 functions as a terminal applying disconnection potential $V_{cut}$ to the fuse 10 so as to allow the current to flow therethrough when the fuse 10 is blown as the need arises, and is grounded after the state of the fuse 10 is determined. The "determined state" herein refers to a state of disconnection of the fuse 10, or a state of the fuse 10 remained in connection because there is no need of disconnecting the fuse 10. It is to be noted that the ground to which the terminal 40 is connected is, for instance, a ground frame of a package encapsulating a semiconductor chip therein. The terminal 40 may be connected with the external of the chip, or may be connected with other circuit inside the chip. The terminal 40 in the former case means a pad, for example.

The memory circuit 50 is a latch circuit storing a signal which indicates result of judgment in judgment operation described later. On the path between the memory circuit 50 and the fuse 10, the transfer gate 60 (third transfer gate) is provided. The transfer gate 60 is a CMOS switch, wherein the output end thereof is connected to the input end of the memory circuit 50. A P-type FET gate in the transfer gate 60 is connected with an inverter 62. By contribution of the inverter 62, the gate of a P-type FET and the gate of the N-type FET in the transfer gate 60 will have, respectively input therein, signals inverted from each other. A terminal 64 is applied with a potential switching the transfer gate 60 between ON and OFF, and is connected respectively to the input end of the inverter 62 and to the gate of the N-type FET.

The input end of the transfer gate 60 is connected with the logic gate 70. The configuration herein is such as allowing a signal (output signal) output from the logic gate 70 to transmit through the transfer gate 60 to be input to the memory circuit 50. In other words, the memory circuit 50 can have, as an output signal from the logic gate 70 input therein, a signal indicating the result of judgment, and can store it. The logic gate 70 is a NAND circuit, and can have input of a reference signal and a potential signal at the end portion 10b of the fuse 10, and can output a NAND of them as an output signal.

One input end of the logic gate 70 is connected through an inverter 88 to the terminal 36. This allows a result of inversion of the potential applied to the terminal 36 to be input to the logic gate 70. The other input end of the logic gate 70 is connected to the end portion 10b. In the judgment operation, a high level (source potential $V_{cc}$) is applied as the reference signal to the logic gate 70. The output signal from the logic gate 70 will therefore have a high value or a low value, depending on a potential signal at the end portion 10b. In other words, the logic gate 70 outputs 0 if a value of the potential signal falls on the high side of the threshold value of the logic gate 70, and outputs 1 if it falls on the low (ground potential) side.

The logic gate 70 is involved in a positive feedback system. More specifically, there is provided a P-type FET 72 having the gate connected to the output end of the logic gate 70, and the drain connected to the input end (input end connected to the end portion 10b) of the logic gate 70. The source of the P-type FET 72 is connected to the terminal 74 applied with the source potential $V_{cc}$. In other words, the configuration is such as turning the FET 72 on when the output signal of the logic gate 70 is low, and allowing the source potential $V_{cc}$ applied to the terminal 74 to be input to the logic gate 70.

Figure 2:
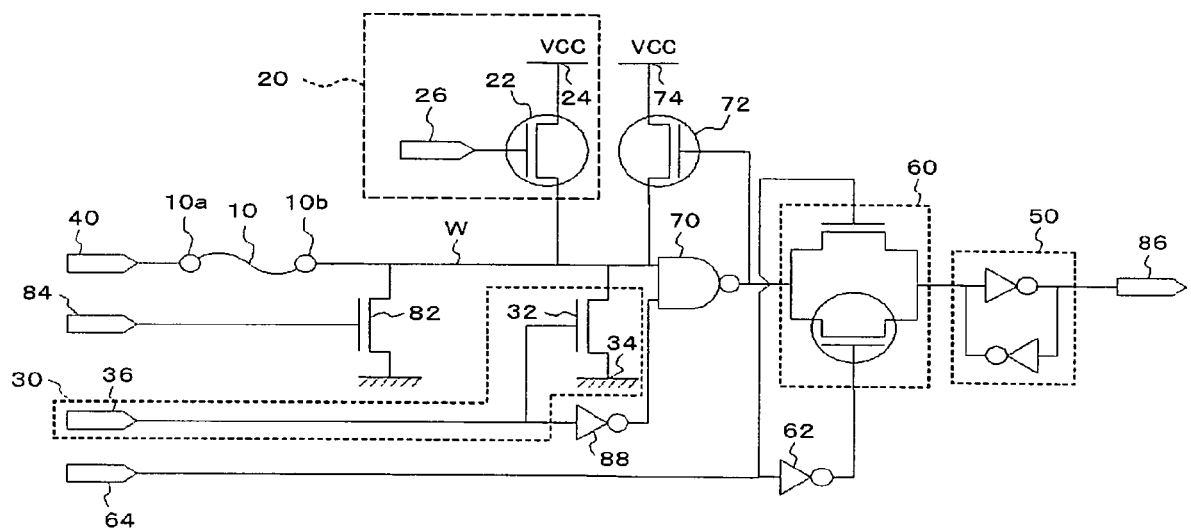
FIG. 2 is a circuit diagram showing a fuse peripheral circuit contained in the semiconductor device shown in FIG. 1.

The circuit shown in FIG. 2 additionally has a transfer gate 82, a terminal 84 and a terminal 86. The transfer gate 82 has the source grounded and the drain connected to the end portion 10b. The terminal 84 is connected to the gate of the transfer gate 82. The terminal 84 is applied with a potential switching the transfer gate 82 between ON and OFF. The terminal 86 is connected to the output end of the memory circuit 50, so as to read result of judgment stored in the memory circuit 50.

The transfer gate 82 and the terminal 84 configure a current supply circuit supplying current to the fuse 10 when it is blown. More specifically, current is supplied to the fuse 10 to be blown, by turning the transfer gate 82 on, while keeping the terminal 40 applied with disconnection potential $V_{cut}$. The disconnection may be effected by heat or by electro-migration. It is to be noted that the fuse 10 may be blown either on a wafer or on a chip.

It is necessary to judge which of the intrinsic bit line and the redundant bit line should be used, before the semiconductor device 1 starts to operate. Whether the fuse 10 has been blown or not is therefore judged when the semiconductor device 1 is powered on.

Figure 3:
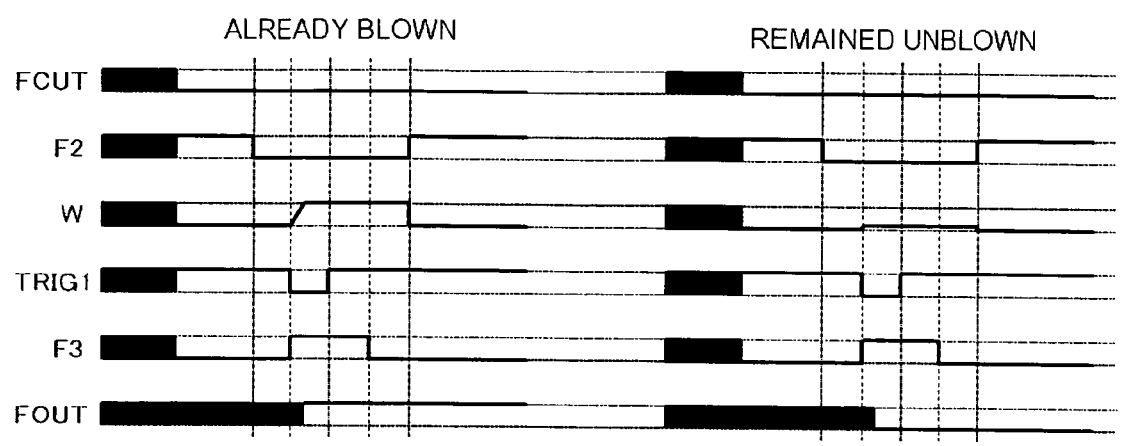
FIG. 3 is a timing chart explaining a disconnection-judging operation in the circuit shown in FIG. 2.

Operation of judgment of disconnection takes place in the circuit shown in FIG. 2 will be explained referring to the timing chart shown in FIG. 3. In FIG. 3, FCUT, F2, TRIG1, F3 and FOUT represent each potential respectively at the terminal 84, the terminal 36, the terminal 26, the terminal 64 and the terminal 86. W represents potential of an interconnection W connecting the end portion 10b of the fuse 10 and the input end of the logic gate 70. Potential at the terminal 84 is always kept low, when the disconnection judgment takes place.

First, the terminals 26, 36 are brought into high, and the terminal 64 into low. In this situation, the transfer gates 82, 22 and 60 are turned off, the transfer gate 32 is turned on, and the interconnection W is grounded. Bringing the terminal 36 into low turns the transfer gate 32 off, and makes the interconnection W float while allowing it to remain under the ground potential. Bringing the terminal 36 into low also makes output of the logic gate 70 reflect the potential of the interconnection W. Next, the terminal 64 is brought into high so as to turn the transfer gate 60 on, and so as to make an output of the logic gate 70 transmittable to the memory circuit 50. At the same time, the terminal 26 is temporarily brought into low so as to turn the transfer gate 22 on for a predetermined duration of time, to thereby charge the interconnection W.

If the fuse 10 has been blown by this time, electric charge accumulated on the interconnection W is maintained, and the potential of the interconnection W is consequently kept at an elevated state (high state). This makes an output signal of the logic gate 70 low, and makes the potential of the terminal 86 high.

On the contrary, if the fuse 10 has been kept in connection, the electric charge accumulated on the interconnection W leaks through the terminal 40 to the ground (that is, the charging will not intrinsically occur), and the interconnection W is brought down to the ground potential (low). This brings an output of the logic gate 70 up to high and the terminal 86 down to low.

After the output of the logic gate 70 is kept by the memory circuit 50, the terminal 64 is brought down to low to thereby turn the transfer gate 60 off. This makes it possible to memorize the output of the logic gate 70, that is, a result of judgment on whether the fuse 10 has been blown or not. State of the fuse 10, that is, which bit line should be used, is then judged depending on the logical state (high or low) of the terminal 86.

After the transfer gate 60 is turned off, the transfer gate 32 is turned on. This brings the potential of the interconnection W down to the ground potential, and the potential difference between both ends of the fuse 10 becomes substantially zero. This state is kept unchanged during the normal operation of the semiconductor device 1, and the potential difference applied to the fuse 10 remains zero.

Effect of the semiconductor device 1 will be explained. The semiconductor device 1 has the potential difference reducing circuit 30 provided therein. The potential difference between both ends of the fuse, applied by the potential difference imparting circuit 20 when the judgment of disconnection takes place, can therefore be reduced after the judgment. This makes it possible to reduce a risk of short-circuiting of the blown fuse 10.

In particular in the first embodiment, the risk of short-circuiting can distinctively be reduced because the potential difference is reduced to as low as substantially zero by the potential difference reducing circuit 30. This is ascribable to that the potential (third potential) to be applied to the terminal 34 is set equal to the potential (first potential) applied to the end portion 10a of the fuse 10. It is, however, to be understood that the third potential is not necessarily equal to the first potential, and may be not lower than the first potential and not higher than the second potential. The second potential herein expresses the potential applied to the terminal 24 as described in the above.

The fuse 10 is blown by allowing current to flow therethrough, so that it is particularly important to install the potential difference reducing circuit 30. More specifically, such fuse generally produces only a small disconnection gap (a gap between fragments of the fuse produced by the disconnection), and tends to cause short-circuiting due to electro-migration. In contrast, the semiconductor device 1 having the potential difference reducing circuit 30 makes it possible to fully reduce the risk of short-circuiting. The fuse 10 herein is by no means limited to those disconnectable by current. It may be, for example, such as disconnectable by laser. Also for the case of laser disconnection, it is important to provide the potential difference reducing circuit 30, because the disconnection gap has been becoming smaller as the semiconductor device has been more micronized and laser output has been enhanced.

In the semiconductor device 1, the terminal 40 allowing current to flow therethrough to the fuse 10 for disconnection is grounded. This makes it possible to save power consumption of the semiconductor device 1. The terminal 40 may typically be an external terminal formed on the surface of the semiconductor device 1. The terminal 40 is, however, not necessarily be an external terminal, so far as the semiconductor device 1 per se can supply voltage or current sufficient for the disconnection of the fuse 10. If it cannot be supplied, it is all enough to configure the terminal 40 as the external terminal, and to externally supply a large voltage or current.

The potential difference imparting circuit 20 is configured as having the transfer gate 22 and the terminal 24. This successfully realizes the potential difference imparting circuit 20 based on a simple configuration. The potential difference reducing circuit 30 is configured as having the transfer gate 32 and the terminal 34. This successfully realizes the potential difference reducing circuit 30 based on a simple configuration.

The semiconductor device I has the memory circuit 50 and the transfer gate 60. In this case, a signal once stored in the memory circuit 50 is prevented from leaking from the memory circuit 50 to the fuse 10 side. This makes it possible to maintain, based on only a simple configuration, a state of potential difference between both ends of the fuse 10 reduced by the potential difference reducing circuit 30.

The semiconductor device 1 includes the logic gate 70 provided therein. Potential signal appeared at one end 10b of the fuse 10 is therefore converted into a high or low output signal by the logic gate 70, and the output signal is obtained as a result of the disconnection judgment of the fuse 10. This makes it possible to reduce the risk of misjudgment of the disconnection of the fuse 10.

Meanwhile, when the potential of the interconnection W is input to the memory circuit 50 without allowing it to pass through the logic gate 70, the potential to be input to the memory circuit 50 may have a value close to the threshold voltage of the inverter in the memory circuit 50 due to voltage drop. This may fail in inverting the latch, so that a false result of judgment may undesirably be stored in the memory circuit 50. In contrast, the semiconductor device 1 is configured as allowing the output signal of the logic gate 70, having a large current supply capacity, to be stored in the memory circuit 50, so that it is made possible to make the memory circuit 50 correctly store information of whether the fuse 10 has been blown or not.

The logic gate 70 is configured so that the output signal therefrom is transmitted through the transfer gate 60 to be input to the memory circuit 50. The transfer gate 60 is effective in view of preventing the information stored in the memory circuit 50 from leaking to the fuse 10 side, as described in the above. On the other hand, the transfer gate 60 may also be a causal factor of undesirably making, due to voltage drop of its own, the potential to be input to the memory circuit 50 close to the threshold voltage of the inverter. In the semiconductor device 1, it is therefore particularly important to provide the logic gate 70 in order to make the memory circuit 50 store correct information.

The logic gate 70 is involved in a positive feedback loop. This makes it possible to rapidly determine the output signal of the logic gate 70. The first embodiment successfully realizes the positive feedback based on a simple configuration, by using the FET 72 and the terminal 74.

A NAND is used as the logic gate 70. The NAND is preferably used as the logic gate 70. The NAND, which can be configured by a relatively small number of transistors, is also contributive to saving of circuit resources. It is, however, to be noted that the logic gate 70 may be configured by using a logic gate other than NAND, such as an inverter.

Second Embodiment

Figure 4:
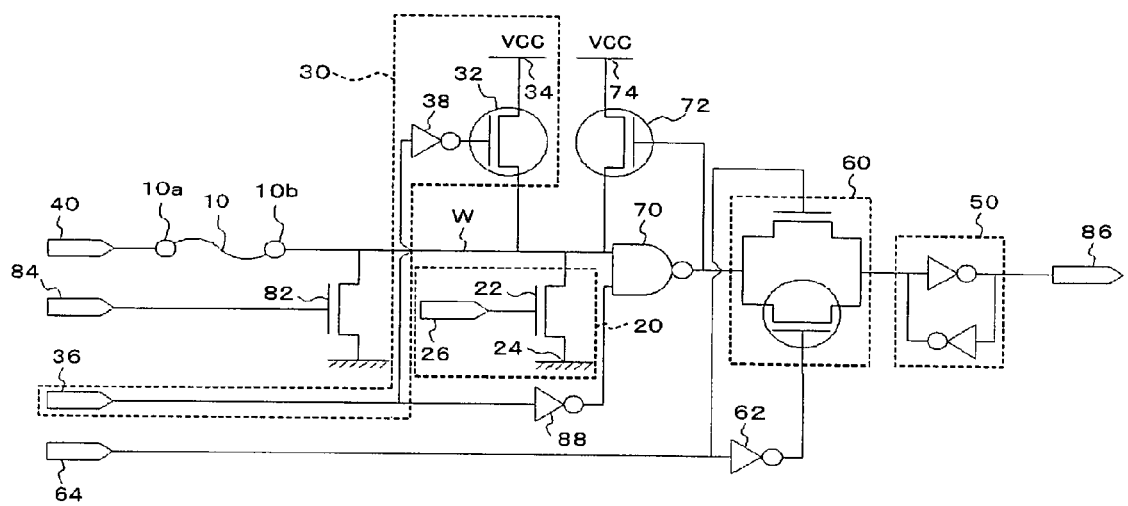
FIG. 4 is a circuit diagram showing the fuse peripheral circuit contained in the semiconductor device according to the second embodiment of the present invention.

FIG. 4 is a circuit diagram showing the fuse peripheral circuit in the second embodiment of the semiconductor device of the present invention. The fuse peripheral circuit has the fuse 10, the potential difference imparting circuit 20, the potential difference reducing circuit 30, the terminal 40, the memory circuit 50, the transfer gate 60 and the logic gate 70. Of these components, configurations of the fuse 10, the terminal 40, the memory circuit 50, the transfer gate 60 and the logic gate 70 are same as those shown in FIG. 2. In the second embodiment, the terminal 40 is applied with the source potential V.

The potential difference imparting circuit 20 is configured as having the transfer gate 22, the terminal 24 and the terminal 26, so as to produce a predetermined potential difference between both ends of the fuse 10 when the disconnection judgment takes place. The transfer gate 22 herein is an N-type FET. The terminal 24 is connected to the source of the transfer gate 22. The terminal 24 is applied with the ground potential (second potential). In the second embodiment, the second potential has therefore a value smaller than the potential $V_{cc}$ (first potential) applied to the end portion 10a of the fuse 10.

The potential difference reducing circuit 30 is configured as having the transfer gate 32, the terminal 34, the terminal 36 and an inverter 38, so as to reduce the potential difference between both ends of the fuse 10 applied by the potential difference imparting circuit 20. The transfer gate 32 is a P-type FET. The terminal 34 is connected to the source of the transfer gate 32. The terminal 34 is supplied with the source potential $V_{cc}$ (third potential). The terminal 36 is connected through the inverter to the gate of the transfer gate 32.

Figure 5:
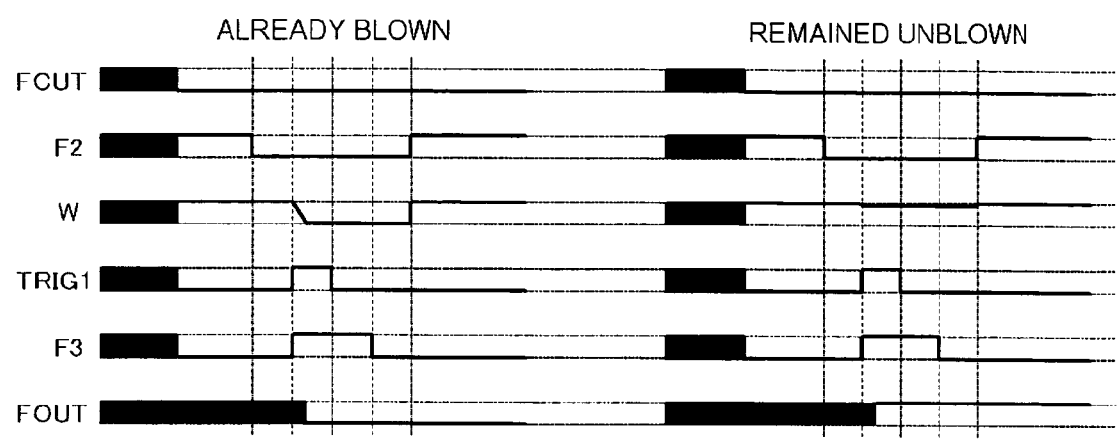
FIG. 5 is a timing chart explaining a disconnection-judging operation in the circuit shown in FIG. 4.

Next paragraphs will describe operations of the disconnection judgment taken place in the circuit shown in FIG. 4, referring to the timing chart shown in FIG. 5. Meanings of the individual reference numerals are same as those shown in FIG. 3. The potential of the terminal 84 is always kept low when the disconnection judgment takes place.

First, the terminal 36 is brought up to high, and the terminals 26, 64 are brought down to low. In this situation, the transfer gates 82, 22 and 60 are turned off, the transfer gate 32 is turned on, and the interconnection W is supplied with the source potential $V_{cc}$. Bringing the terminal 36 down to low turns the transfer gate 32 off, and makes the interconnection W float while allowing it to retain the source potential $V_{cc}$ as is in the state immediately before. Bringing the terminal 36 down to low also makes output of the logic gate 70 reflect the potential of the interconnection W. Next, the terminal 64 is brought into high so as to turn the transfer gate 60 on, and so as to make an output of the logic gate 70 transmittable to the memory circuit 50. At the same time, the terminal 26 is temporarily brought into high so as to turn the transfer gate 22 on for a predetermined duration of time, to thereby leak the charge accumulated in the interconnection W to the ground.

If the fuse 10 has been blown by this time, the interconnection W is brought down to the ground potential. This makes the output of the logic gate 70 high and the terminal 86 low.

On the contrary, if the fuse 10 has been kept in connection, the interconnection W is charged by the source potential $V_{cc}$ applied to the terminal 40. This makes the output of the logic gate 70 low, and the potential of the terminal 86 high.

After the output of the logic gate 70 is held by the memory circuit 50, the terminal 64 is brought down to low to thereby turn the transfer gate 60 off. This makes it possible to memorize the output of the logic gate 70, that is, a result of judgment on whether the fuse 10 has been blown or not. State of the fuse 10, that is, which bit line should be used, is then judged depending on the logical state (high or low) of the terminal 86.

After the transfer gate 60 is turned off, the transfer gate 32 is turned on. This brings the potential of the interconnection W into the source potential $V_{cc}$, and the potential difference between both ends of the fuse 10 becomes substantially zero. This state is kept unchanged during the normal operation of the semiconductor device 1, and the potential difference applied to the fuse 10 remains zero.

Also the semiconductor device of the second embodiment, having the potential difference reducing circuit 30 provided therein, can reduce the potential difference, which has been applied between both ends of the fuse by the potential difference imparting circuit 20 when the judgment takes place, after the judgment. This successfully reduces a risk of short-circuiting of the blown fuse 10. Moreover, it is made possible to distinctively reduce the risk of short-circuiting, because the potential difference is reduced to as low as substantially zero by the potential difference reducing circuit 30. It is, however, to be understood that the third potential is not necessarily equal to the first potential, and may be higher than the first potential and not higher than the second potential.

There is provided the logic gate 70. By this configuration, the potential signal appears at one end 10b of the fuse 10 is converted into a high or low output signal by the logic circuit, and the output signal therefrom is obtained as a result of the judgment on disconnection of the fuse 10. This makes it possible to reduce the risk of misjudgment of the disconnection of the fuse 10.

Figure 6:
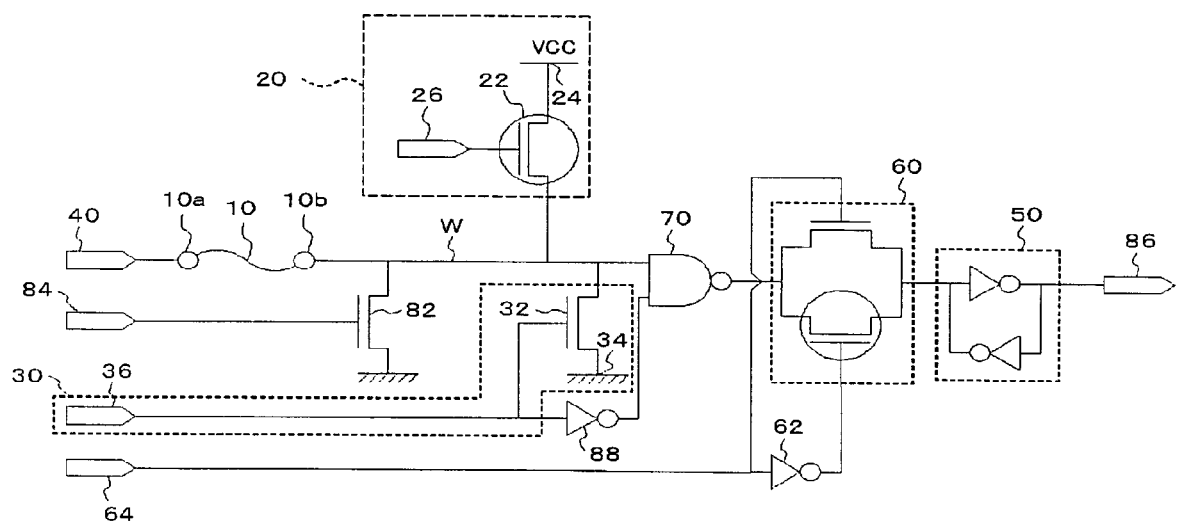
FIG. 6 is a circuit diagram showing a modified example of the semiconductor device of the present invention.

The semiconductor device of the present invention is by no means limited to the above embodiments, and may be modified in various ways. For example, as shown in FIG. 6, the logic gate 70 may be configured as being not involved in the positive feedback loop. The circuit shown in this drawing corresponds to the circuit shown in FIG. 2, having the FET 72 and the terminal 74 excluded therefrom.

Figure 7:
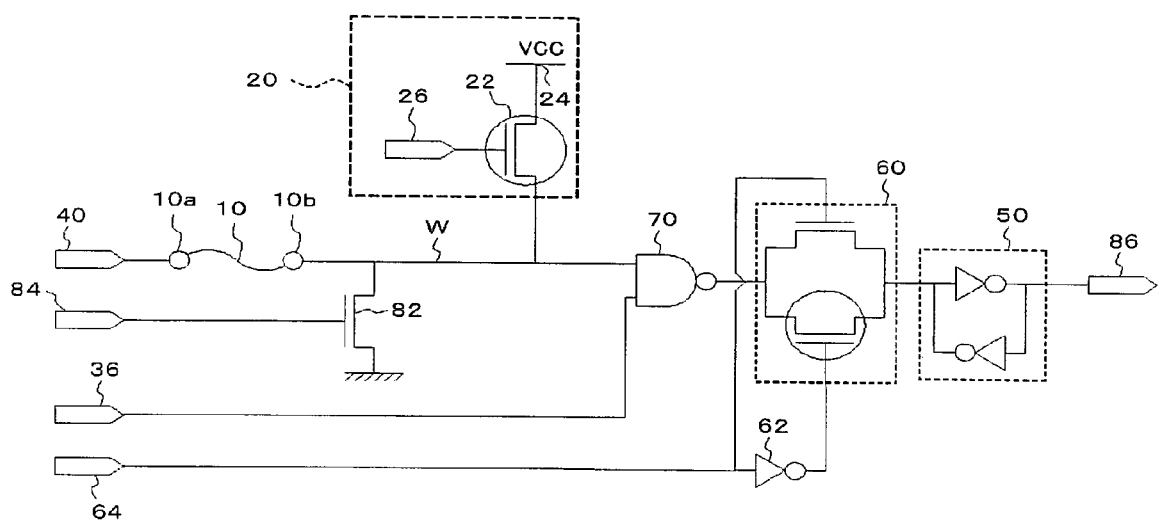
FIG. 7 is a circuit diagram showing another modified example of the semiconductor device of the present invention.

It is also allowable, as shown in FIG. 7, to use a single transfer gate both as the transfer gate of the potential difference reducing circuit and as the transfer gate supplying current to the fuse for the disconnection. The circuit shown in this drawing corresponds to the circuit shown in FIG. 6, having the transfer gate 32, the terminal 34 and the inverter 88 excluded therefrom. In this circuit, the transfer gate 82, the terminal connected to the transfer gate 82 and the terminal 84 configure the potential difference reducing circuit.

Figure 8:
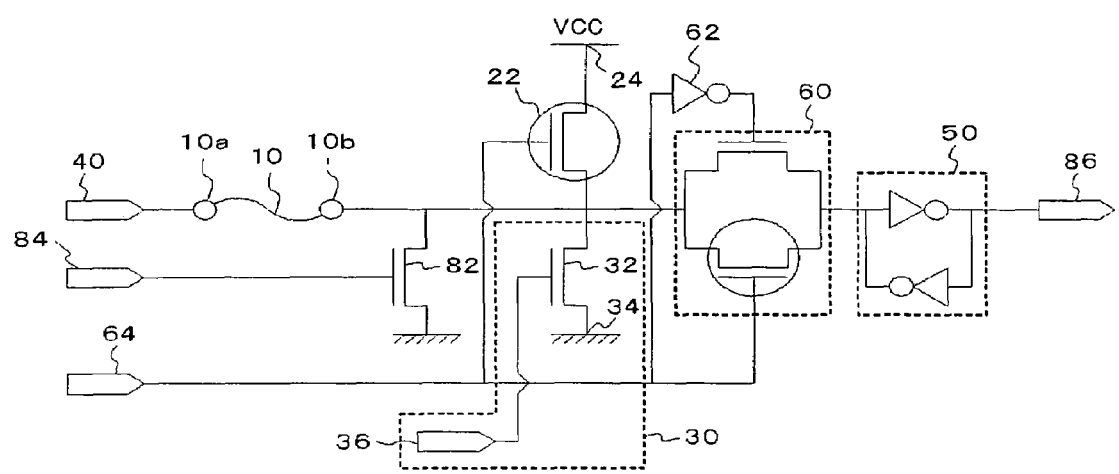
FIG. 8 is a circuit diagram showing another modified example of the semiconductor device of the present invention.
Figure 9:
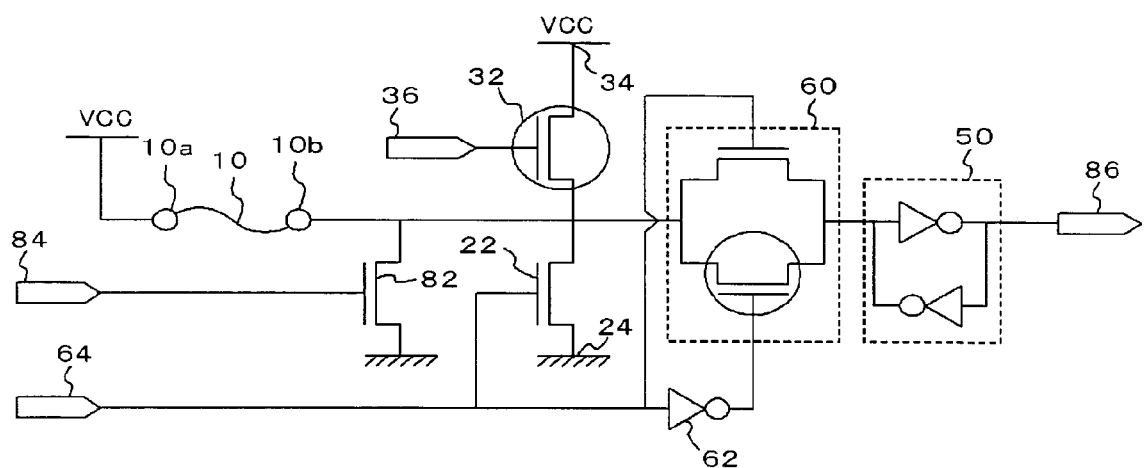
FIG. 9 is a circuit diagram showing another modified example of the semiconductor device of the present invention.
Figure 10:
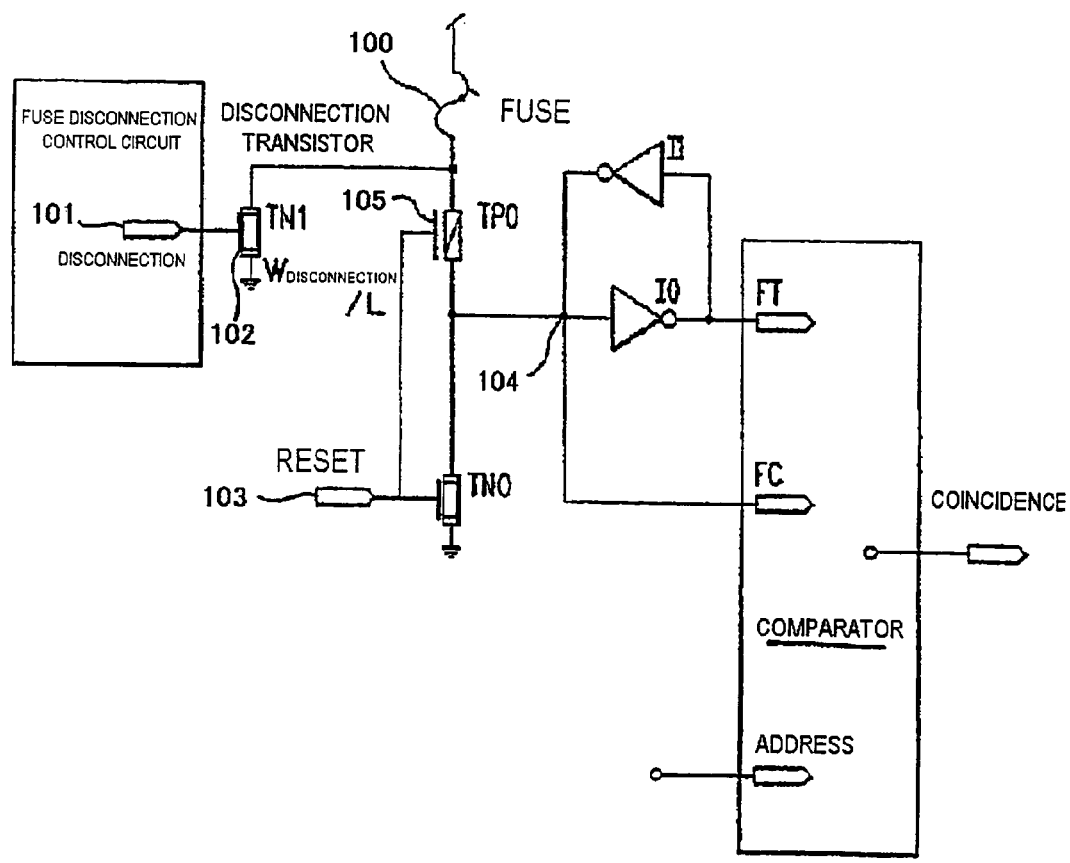
FIG. 10 is a circuit diagram showing a fuse peripheral circuit described in Japanese Laid-Open Patent Publication No. 6-140510.

It is still also allowable, as shown in FIG. 8 and FIG. 9, to apply configurations having no logic gate 70 provided therein. The circuit shown in FIG. 8 corresponds to the circuit shown in FIG. 6, having the logic gate 70 and the inverter 88 excluded therefrom. The circuit shown in FIG. 9 corresponds to the circuit shown in FIG. 4, having the FET 72, the terminal 74, the logic gate 70 and the inverters 88, 38 excluded therefrom. In the circuits shown in FIG. 8 and FIG. 9, a single pad is used both as a terminal switching the transfer gate 60 between ON and OFF, and as a terminal switching the transfer gate 22 between ON and OFF. In these circuits, the transfer gate 22, the terminal 24 and the terminal 64 compose the potential difference imparting circuit. In these circuits, the end portion 10b of the fuse 10 is directly connected to the input end of the transfer gate 60.

It is apparent that the present invention is not limited to the above embodiments, and may be modified and changed without departing from the scope and spirit of the invention.

What is claimed is:

1. A semiconductor device comprising:
   a fuse;
   a potential difference imparting circuit imparting a predetermined potential difference between both ends of said fuse when disconnection of said fuse is judged; and
   a potential difference reducing circuit reducing said potential difference applied between both ends of said fuse, said potential difference reducing circuit reducing a potential difference when disconnection of said fuse is not judged.

2. The semiconductor device as claimed in claim 1, wherein said potential difference reducing circuit is configured so as to nearly equalize the potential on both sides of said fuse.

3. The semiconductor device as claimed in claim 1, further comprising a terminal connected to one end of said fuse, supplying current to said fuse when said fuse is blown, said terminal being grounded.

4. The semiconductor device as claimed in claim 1, wherein said potential difference imparting circuit comprises a first transfer gate, and a first terminal connected through said first transfer gate to the other end of said fuse, being applied with a second potential higher than a first potential applied to one end of said fuse; and
   said potential difference reducing circuit comprises a second transfer gate, and a second terminal connected through said second transfer gate to the other end of said fuse, being applied with a third potential not lower than said first potential and lower than said second potential.

5. The semiconductor device as claimed in claim 1, wherein said potential difference imparting circuit comprises a first transfer gate, and a first terminal connected through said first transfer gate to the other end of said fuse, being applied with a second potential lower than a first potential applied to one end of said fuse; and
   said potential difference reducing circuit comprises a second transfer gate, and a second terminal connected through said second transfer gate to the other end of said fuse, being applied with a third potential higher than said second potential and not higher than said first potential.

6. The semiconductor device as claimed in claim 1, further comprising a memory circuit storing a signal which indicates result of judgment on whether said fuse has been blown or not, and a third transfer gate provided on a path between said memory circuit and said fuse.

7. The semiconductor device as claimed in claim 6, further comprising a logic gate which is provided on a path between said fuse and an input of said third transfer gate.

* * * * *